United States Patent
Zhao (10) Patent No.: US 9,601,620 B2
(45) Date of Patent: Mar. 21, 2017

(54) TRANSISTOR AND FABRICATION METHOD THEREOF

(71) Applicant: Semiconductor Manufacturing International (Shanghai) Corporation, Shanghai (CN)

(72) Inventor: Jie Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/931,189

(22) Filed: Nov. 3, 2015

(65) Prior Publication Data
US 2016/0133744 A1 May 12, 2016

(30) Foreign Application Priority Data
Nov. 6, 2014 (CN) .......................... 2014 1 0624231

(51) Int. Cl.
| | |
|---|---|
| H01L 27/088 | (2006.01) |
| H01L 21/338 | (2006.01) |
| H01L 21/336 | (2006.01) |
| H01L 21/3205 | (2006.01) |
| H01L 29/78 | (2006.01) |
| H01L 29/66 | (2006.01) |
| H01L 29/49 | (2006.01) |
| H01L 29/51 | (2006.01) |

(52) U.S. Cl.
CPC ........ *H01L 29/7843* (2013.01); *H01L 29/495* (2013.01); *H01L 29/517* (2013.01); *H01L 29/66545* (2013.01); *H01L 29/7851* (2013.01)

(58) Field of Classification Search
CPC ............. H01L 29/7843; H01L 29/0653; H01L 29/495; H01L 29/517; H01L 29/66545; H01L 29/7851
USPC .......... 257/401, 369, 622, 192, E21.44, 768; 438/595, 283, 585, 183, 296, 230, 303
See application file for complete search history.

(56) References Cited

U.S. PATENT DOCUMENTS

| | | | | |
|---|---|---|---|---|
| 2001/0055842 A1* | 12/2001 | Uh | ..................... | H01L 21/76895 438/183 |
| 2005/0032286 A1* | 2/2005 | Lee | .................... | H01L 21/28167 438/183 |
| 2006/0046448 A1* | 3/2006 | Barns | ................. | H01L 21/28079 438/585 |

(Continued)

*Primary Examiner* — Long K Tran
*Assistant Examiner* — Dzung Tran
(74) *Attorney, Agent, or Firm* — Anova Law Group, PLLC (57) ABSTRACT

A method for forming transistors includes providing a substrate having at least a dummy gate structure having at least dummy gate layer; forming a first dielectric layer on the substrate; thinning the first dielectric layer with a predetermined depth to cause a top surface of the dielectric layer to be lower than a top surface of the dummy gate structure and expose top portions of side surfaces of the dummy gate structure; forming a stress layer on the exposed portions of the side surfaces of the dummy gate structure; forming a second dielectric layer on the thinned first dielectric layer; removing the dummy gate layer to form an opening with an enlarged top size caused by releasing stress in the stress layer previously formed on the exposed portions of the side surfaces of the dummy gate structure; and forming a gate electrode layer in the opening.

15 Claims, 5 Drawing Sheets

(56) References Cited

U.S. PATENT DOCUMENTS

2008/0073733 A1* 3/2008 Kudo ............... H01L 21/28097
  257/412
2013/0078778 A1* 3/2013 Chien ............... H01L 29/66795
  438/296

* cited by examiner

TRANSISTOR AND FABRICATION METHOD THEREOF

CROSS-REFERENCES TO RELATED APPLICATIONS

This application claims the priority of Chinese patent application No. 201410624231.X, filed on Nov. 6, 2014, the entirety of which is incorporated herein by reference.

FIELD OF THE INVENTION

The present invention generally relates to the field of semiconductor manufacturing technology and, more particularly, to transistors and fabrication processes thereof.

BACKGROUND

With the rapid development of semiconductor manufacturing technology, the size of semiconductor devices in an integrated circuit (IC), especially the Metal-Oxide-Semiconductor (MOS) devices, has become smaller and smaller to match the integration and miniaturization requirements of the IC development. Transistors are the major components of MOS devices.

When the size of the transistor is continuously reduced, the gate dielectric layer made of silicon oxide or silicon oxynitride is unable to match the performance requirements. For example, the transistor having the gate dielectric layer made of silicon oxide or silicon oxynitride may have leakage current issue, and/or dopant diffusion issue, etc. Thus, the threshold voltage of the transistor may be adversely affected; and the reliability and stability of the transistor may be reduced.

In order to solve the previously described problems, transistors having a high dielectric constant (high-K) dielectric layer and a metal gate layer have been developed. Such transistors are referred as High-K-metal gate (HKMG) transistors. The HKMG transistors use high-K material to substitute the conventional silicon oxide or silicon oxyinitride as the gate dielectric material; and use metal material or metal compound to substitute the conventional polysilicon as the gate material to form metal gates. The HKMG transistors are able to reduce leakage current, and reduce working voltage and power consumption when the size of the transistors is reduced. Thus, the performance of the transistors may be enhanced.

However, when the technical node of the semiconductor technology is continuously reduced, the size of the HKMG transistors is also continuously reduced; and the device density is continuously increased. Thus, it may be difficult to control the fabrication process of the HKMG transistors; and the performance of the HKMG transistors may be unstable. The disclosed device structures and methods are directed to at least partially solve one or more problems set forth above and other problems.

BRIEF SUMMARY OF THE DISCLOSURE

One aspect of the present disclosure includes a method for fabricating transistors. The method includes providing a substrate having at least a dummy gate structure having at least a dummy gate layer; forming a first dielectric layer on the substrate; thinning the first dielectric layer to a pre-determined depth to cause top surface of the dielectric layer to be lower than top surface of the dummy gate structure and expose top portions of the side surfaces of the dummy gate structure; forming a stress layer on the exposed portions of the side surfaces of the dummy gate structure to enlarge top size of the subsequently formed opening to aid the subsequent formation of a gate layer in the opening; forming a second dielectric layer on the thinned first dielectric layer; removing the dummy gate layer to form the opening with an enlarge top size caused by releasing stress in the stress layer; and forming a gate electrode layer in the opening.

Another aspect of the present disclosure includes a semiconductor structure having at least a transistor. The semiconductor structure includes a substrate having a surface; and at least a gate structure formed on the surface of substrate. Further, the semiconductor structure includes a stress layer for enlarging top portion of an opening for forming the gate structure on top portions of the side surfaces of the gate structure; a first dielectric layer with a surface lower than a top surface of the gate structure formed on the surface substrate and covering bottom portions of the side surfaces of the gate structure; and a second dielectric layer formed on the first dielectric layer and covering side surfaces of the stress layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described previously, with the continuous decreasing of the technical node of the semiconductor technology, the technical difficulties for forming HKMG transistors are increased. The performance of the HKMG transistors may not match the designed requirements.

Usually, the HKMG transistors are formed by a gate-last process. FIGS. 1~4 illustrate semiconductor structures corresponding to certain stages of an existing gate-last process for forming HKMG transistors.

Figure 1:
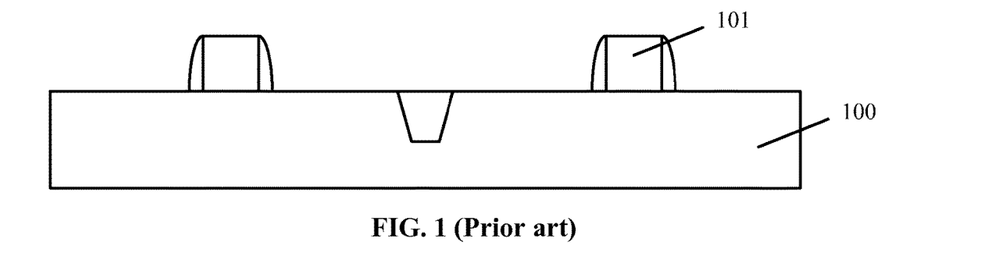
FIGS. 1~4 illustrate structures corresponding to certain stages of an existing fabrication process of HKMG transistors.

As shown in FIG. 1, at the beginning of the fabrication process, a substrate 100 is provided; and a dummy gate layer 101 is formed on the surface of the substrate 100. The dummy gate layer 101 is made of polysilicon. The dummy gate layer 101 defines the size and position of the subsequently formed metal gate.

Figure 2:
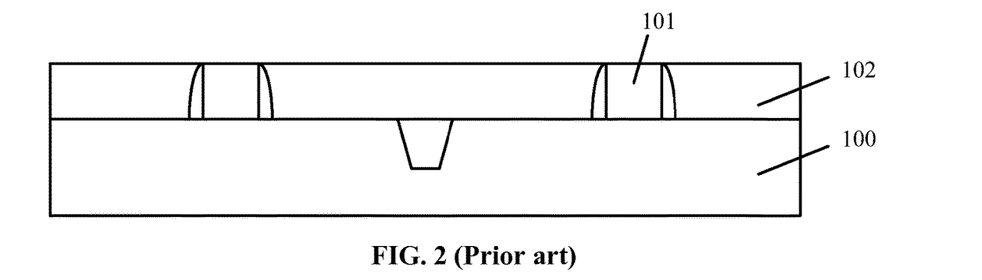

Further, as shown in FIG. 2, a dielectric layer 102 is formed on the surface of the substrate 100. The dielectric layer covers the side surfaces of the dummy gate layer 101.

Further, the top surface of the dielectric layer 102 may level with the top surface of the dummy gate layer 101.

Figure 3:
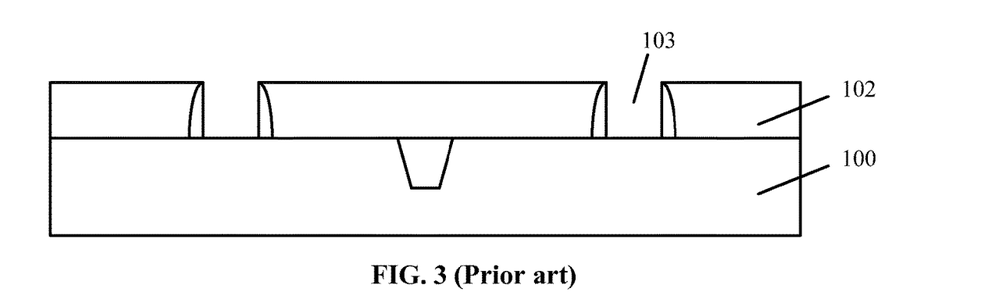
Figure 4:
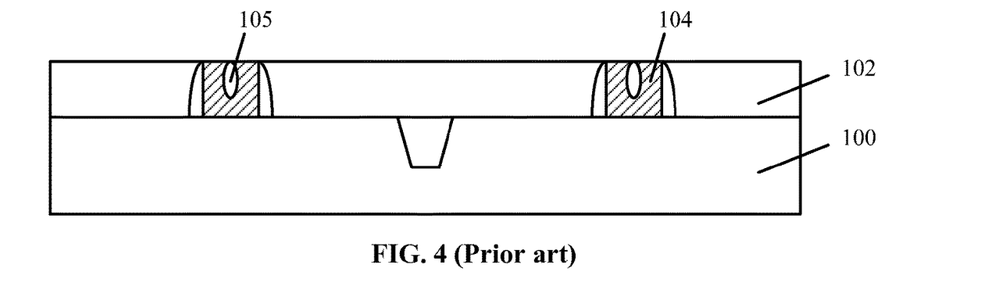

Further, as shown in FIG. 3, the dummy gate layer 101 is removed and openings 103 are formed in the dielectric layer 102. After forming the openings 103, as shown in FIG. 4, a metal gate 104 is formed in each of the openings 103.

With the shrinking of the size of semiconductor device and the increasing of the integration level, the size of the dummy gate 101 formed on the surface of the substrate 100 is reduced. Thus, the size of the openings 103 is also reduced. As show in FIG. 3, the top size of the openings 103 is smaller than approximately 30 nm. On the other hand, the depth of the openings 103 is determined by the thickness of the dummy gate layer 101; and the depth of the openings 103 determines the thickness of the subsequently formed metal gate 104. In order to ensure the threshold voltage of the transistors to match the design requirements, the thickness of the metal gate layer 104 may not be substantially small. That is, the depth of the openings 103 may not be substantially small. When the size of the openings 103 is reduced, the depth-to-width ratio of the openings 103 may be relatively large.

A process for forming the metal gate 104 includes forming a metal film on the surface of the dielectric layer 102 and in the openings 103; and followed by polishing the metal film until the surface of the dielectric layer 102 is exposed. Because the height-to-width ratio of the openings 103 may be relatively large, the difficulty for filling the metal film into the openings 103 may be increased. Thus, it may be difficult for the metal material to reach the bottoms of the openings 103; and the metal material may be accumulated on the top side surfaces of the openings 103. Therefore, the openings 103 may be closed before the openings 103 are entirely filled with the metal material; and voids 105 (as shown in FIG. 4) may be formed in the metal layer in the openings 103. That is, voids 105 may be formed in the metal gates 104 formed by polishing the metal layer.

The voids 105 formed in the metal gates 104 may adversely affect the electrical properties of the metal gates 104, such as resistance, and capacitance, etc. Further, the voids 105 may also affect the threshold voltage of the transistors; and the performance of the transistors may be unstable. According to the disclosed device structures and fabrication processes, the voids may be avoided by forming a stress layer to enlarge the top size of the openings to reduce the difficulty for the metal material to enter the openings.

Figure 14:
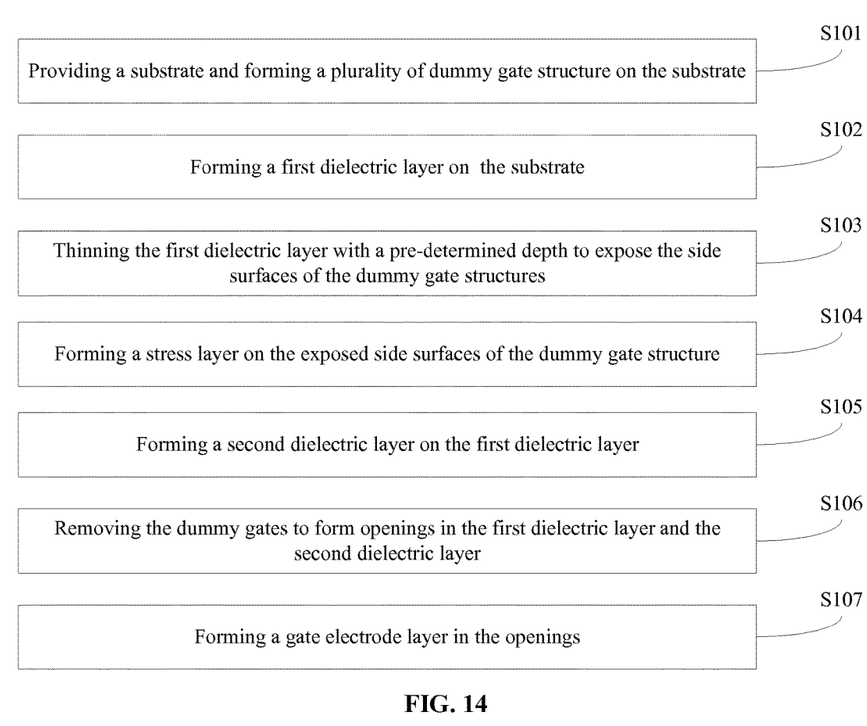
FIG. 14 illustrates an exemplary fabrication process of transistors consistent with the disclosed embodiments.

FIG. 14 illustrates an exemplary fabrication process of a semiconductor structure having a plurality of transistors consistent with the disclosed embodiments; and FIGS. 5~11 illustrate semiconductor structures corresponding to certain stages of the exemplary fabrication process.

Figure 5:
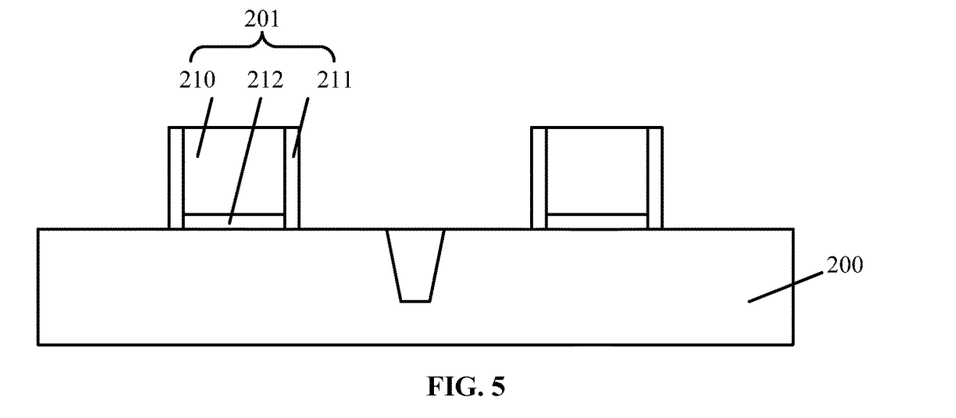
FIGS. 5~11 illustrate semiconductor structures corresponding to certain stages of an exemplary fabrication process of transistors consistent with the disclosed embodiments.

As shown in FIG. 14, at the beginning of the fabrication process, a substrate with certain structures is provided (S101). FIG. 5 illustrates a corresponding semiconductor structure.

As shown in FIG. 5, a substrate 200 is provided. A plurality of the dummy gate structures 201 may be formed on a surface of the substrate 200. Each dummy gate structure 201 may include a gate dielectric layer 212 formed on the surface of the substrate 200, a dummy gate layer 210 formed on the gate dielectric layer 212, and sidewall spacers 211 formed on the side surfaces of the gate dielectric layer 212 and the dummy gate layer 210. Further, shallow trench isolation (STI) structures (not labeled) may be formed in the surface of the substrate 200.

In one embodiment, the substrate 200 may be a planar substrate. The substrate 200 may be made of any appropriate semiconductor materials, including silicon, silicon germanium, silicon carbon, silicon on insulator (SOI) and germanium on insulator (GOI), etc. The substrate 200 may also be a glass substrate, or a III-V compound substrate, such as gallium nitride, or gallium arsenide, etc.

In certain other embodiments, the substrate 200 may include a base substrate, a plurality of fins formed on the base substrate, and an insulation layer formed on the base substrate. The insulation layer may cover portions of the side surfaces of the fins; and the top surface of the insulation layer may be lower than the top surface of the fins. The dummy gate structures may be over the fins; and the dummy gate structure may be on portions of the insulation layer, and the side and bottom surfaces of the fins.

In one embodiment, the fins and the base substrate may be formed by etching a semiconductor substrate. The semiconductor substrate may include silicon, silicon germanium, silicon carbon, silicon on insulator (SOI) and germanium on insulator (GOI), etc. By etching the semiconductor substrate, a plurality of trenches may be formed in the semiconductor substrate. The portions of the semiconductor substrate between adjacent trenches may form the plurality of fins; and the portion of the semiconductor substrate under the fins may form the base substrate.

In certain other embodiments, the fins may be formed on the surface of the base substrate by an epitaxial growth process. The base substrate may include silicon, silicon germanium, silicon carbon, silicon on insulator (SOI) and germanium on insulator (GOI), etc. The fins may be made of silicon, silicon germanium, germanium, or silicon carbide, etc.

The dummy gate layer 210 may occupy the space and position of the subsequently formed gate electrode layer. In one embodiment, a mask layer (not shown) may be formed on the surface of the dummy gate layer 210.

A process for forming the dummy gate layer 210 may include forming a dummy gate film on the surface of the substrate 200; forming the mask layer covering the region of the dummy gate film corresponding to the dummy gate layer 210 on the dummy gate film; and etching the dummy gate film using the mask layer as an etching mask until the surface of the substrate 200 is exposed. Thus, the dummy gate layer 210 may be formed.

The dummy gate film may be formed by any appropriate process, such as a thermal oxidation process, a chemical vapor deposition (CVD) process, a physical vapor deposition (PVD) process, or an atomic layer deposition (ALD) process, etc. The dummy gate layer 210 may be made of any appropriate material, such as amorphous silicon, or polysilicon, etc.

The thickness of the dummy gate layer 210 may be in a range of approximately 500 Å~1500 Å. The thickness of the dummy gate layer 210 may determine the thickness of the subsequently formed gate electrode layer. The dummy gate layer 210 may be subsequently removed. Amorphous silicon or polysilicon may be easily etched; may have desired morphology; and may be easily removed. Thus, when amorphous silicon or polysilicon is used as the material of the dummy gate layer 210, the dummy gate layer 210 may have desired morphology, stable structure; and may be easily removed.

In one embodiment, the dummy gate layer 210 may be doped with certain ions. The doping ions may be P-type ions, or N-type ions. Various processes may be used to dope the dummy gate layer 210, such as an ion implantation process, or a gas diffusion process, etc. After doping the dummy gate layer 210, a thermal annealing process may be performed to activate the doping ions.

The mask layer may be made of any appropriate material, such as one or more of silicon oxide, silicon oxynitride, carbon-doped silicon oxynitride, and boron-doped silicon oxynitride, etc. The thickness of the mask layer may be in a range of approximately 10 Å~200 Å.

A process for forming the mask layer may include forming a mask material film on the surface of the dummy gate film; forming a patterned layer covering the portion of the dummy gate film corresponding to the dummy gate layer 210; etching the mask material film using the patterned layer as an etching mask until the surface of the dummy gate film is exposed. Thus, the mask layer may be formed.

The mask material film may be formed by a CVD process, or an ALD process, etc. The patterned layer may be a photoresist layer, etc. The patterned layer may also be formed by a multiple-patterning process, such as a Self-Aligned Double Patterning (SADP) process, etc.

Referring to FIG. 5, in one embodiment, the dummy gate dielectric layer 212 may be formed on the surface of the substrate 200; and the dummy gate layer 210 may be formed on the dummy gate dielectric layer 212. The dummy gate dielectric layer 212 may be made of silicon oxide, etc. The thickness of the dummy gate dielectric layer 212 may be in a range of approximately 5 Å~100 Å.

The dummy gate dielectric layer 212 and the dummy gate layer 210 may be made of different materials; and may have a relatively high etching selectivity. Thus, the dummy gate dielectric layer 212 may be able to protect the surface of the substrate 200 when the dummy gate material film is etched to form the dummy gate layer 210 and when the dummy gate layer 210 is subsequently removed.

A process for forming the dummy gate dielectric layer 212 may include forming a dummy gate dielectric film on the surface of substrate 200; forming the dummy gate film on the dummy gate dielectric film; forming the dummy gate layer by etching the dummy gate film until the dummy gate dielectric layer is exposed; and etching the dummy gate dielectric film by a dry etching process, or a wet etching process until the surface of the substrate 200 is exposed. Thus, the dummy gate dielectric layer 212 may be formed. The dummy gate dielectric film may be formed by any appropriate process, such as In-Situ Steam Generation (ISSG) process, or a CVD process, etc.

Because the dummy gate dielectric layer 212 and the substrate 200 may have a relatively large etching selectivity, the damage to the surface of the substrate 200 may be substantially small when the dummy gate dielectric film is etched. In certain other embodiments, the dummy gate dielectric film may not be etched. The dummy gate dielectric film may be used to protect the surface of the semiconductor substrate when source/drain regions are subsequently formed.

In certain other embodiments, the dummy gate structure 201 may include a gate dielectric layer (not shown) formed on the surface of the substrate 200; and the dummy gate dielectric layer may be formed on the gate dielectric layer. After subsequently removing the dummy gate dielectric layer 212, the gate dielectric layer may be exposed.

The gate dielectric layer 212 may be made of any appropriate material, such as high-K material, etc. The high-K material may include LaO, AlO, BaZrO, HfZrO, HfZrON, HfLaO, HfSiO, HfSiON, LaSiO, AlSiO, HfTaO, HfTiO, (BA, Sr)TiO$_3$, Al$_2$O$_3$, and Si$_3$N$_4$, etc. Various processes may be used to form the gate dielectric layer, such as a CVD process, a PVD process, or an ALD process, etc. The thickness of the gate dielectric layer 212 may be in a range of approximately 10 Å~50 Å.

Further, referring to FIG. 5, the dummy gate structure 201 may also include sidewall spacers 211 formed on the side surfaces of the dummy gate layer 210. The sidewall spacers 211 may made of any appropriate material, such as silicon nitride, silicon oxynitride, carbon-doped silicon oxynitride, or boron-doped silicon oxynitride, etc. The thickness of the sidewall spacers 211 may be in a range of approximately 10 Å~200 Å. The sidewall spacers 211 may be a single layer structure, or a multiple-layer structure, etc.

A process for forming the sidewall spacers 211 may include forming a sidewall material layer on the surfaces of the substrate 200 and the dummy gate layer 210; and performing an etch-back process on the sidewall material layer until the surface of the substrate 200 and the surfaces of the mask layer or the dummy gate layer 210 are exposed. Thus, the sidewall spacers 211 may be formed. Various processes may be used to form the sidewall material layer, such as a CVD process, or an ALD process, etc.

After forming the sidewall spacers 211, source/drain regions (not shown) may be formed in the substrate 200 at both sides of the sidewall spacers 211 and the dummy gate layer 210. The source/drain regions may be formed by any appropriate process. In one embodiment, the source/drain regions are formed by an ion implantation process. The doping ions may be P-type ions, or N-type ions.

In certain other embodiments, embedded stress layers may be formed in the substrate 200 at both sides of the sidewall spacers 211 and the dummy gate layer 210. The embedded stress layers may be configured as source/drain regions; and may be referred as embedded source/drain regions. If the embedded stress layers are made of silicon germanium, the embedded stress layers may be doped with P-type ions to be configured as source/drain regions. If the embedded stress layers are made of silicon carbide, the stress layers may be doped with N-type ions to be configured as source/drain regions.

Figure 6:
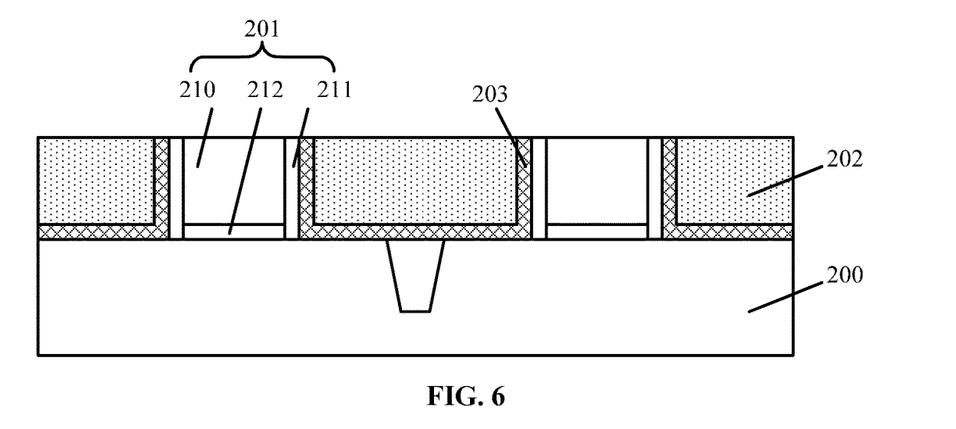

Returning to FIG. 14, after providing the substrate 200 and forming the dummy gate structures 201, a first dielectric layer may be formed (S102). FIG. 6 illustrates a corresponding semiconductor structure.

As shown in FIG. 6, a first dielectric layer 202 is formed on the surface of the substrate 200. The first dielectric layer 202 may cover the side surfaces of the first dummy gate structures 201. The first dielectric layer 202 may also be referred as an interlayer dielectric layer (IDL). Further, the top surface of the first dielectric layer 202 may level with the top surface of the dummy gate structures 201. Further, in one embodiment, a contact etching stop layer (CESL) 203 may be formed on the surface of the substrate 200 and the side surfaces of the dummy gate structures 201.

The first dielectric layer 202 may be used to electrically insulate adjacent dummy gate structures 201. Further, the first dielectric layer 202 may be used to keep the morphological structure of the dummy gate layer 210. After subsequently removing the dummy gate layer 210, it may be able to form openings corresponding to the size and position of the dummy gate layer 210 in the first dielectric layer 202. The openings may be used to subsequently form a metal gate layer.

The first dielectric layer 202 may be made of any appropriate material, such as silicon oxide, silicon nitride, or silicon oxynitride, etc. In one embodiment, the first dielectric layer 202 is made of silicon oxide.

A process for forming the first dielectric layer 202 may include forming a first dielectric film on the surface of the substrate 200 and the surfaces of the dummy gate structures 201; and followed by planarizing the first dielectric film until the top surface of the dummy gates 201 is exposed. Thus, the first dielectric layer 202 may be formed.

The first dielectric film may be formed by any appropriate process, such as a CVD process, or a PVD process, etc. In one embodiment, the first dielectric film is formed by a CVD process. The CVD process may be one or more of a flowable CVD process, or a high-aspect-ratio deposition process.

The first dielectric film may be planarized by any appropriate process, such as a chemical mechanical polishing process, a physical mechanical polishing process, or an ion beam polishing process, etc. In one embodiment, a chemical mechanical polishing process is used to planarize the first dielectric film. In one embodiment, the mask layer may be formed on the surface of the dummy gate layer 210, the planarization process may also be able to remove the mask layer to expose the surface of the dummy gate layer 210. Thus, the top surface of the dummy gate layer 201 may level with the top surface of the first dielectric layer 202.

Referring to FIG. 6, in one embodiment, the CESL 203 may be formed on the surface of the substrate 200 and the surfaces of the dummy gate structures 201 before forming the first dielectric film. That is, the first dielectric film may be formed on the CESL 203. The CESL 203 may be used as a stop layer for the chemical mechanical polishing process. After planarizing the first dielectric film by the chemical mechanical polishing process, the chemical mechanical polishing process may be continued to remove the CESL 203 on the top surface of the dummy gate structures 201 until the top surface of the dummy gate structures 201 is exposed.

The CESL 203 may be made of any appropriate material, such as silicon nitride, carbon-doped silicon oxynitride, or boron-doped silicon nitride, etc. Various processes may be used to form the CESL 203, such as a CVD process, or a PVD process, etc. The thickness of the CESL 203 may be in a range of approximately 10 Å~200 Å.

The CESL 203 may be made of a material different from that of the first dielectric film. The CESL 203 may also be as an etching stop layer when conductive structures are subsequently formed on the source/drain region after subsequently forming a gate electrode layer.

Figure 7:
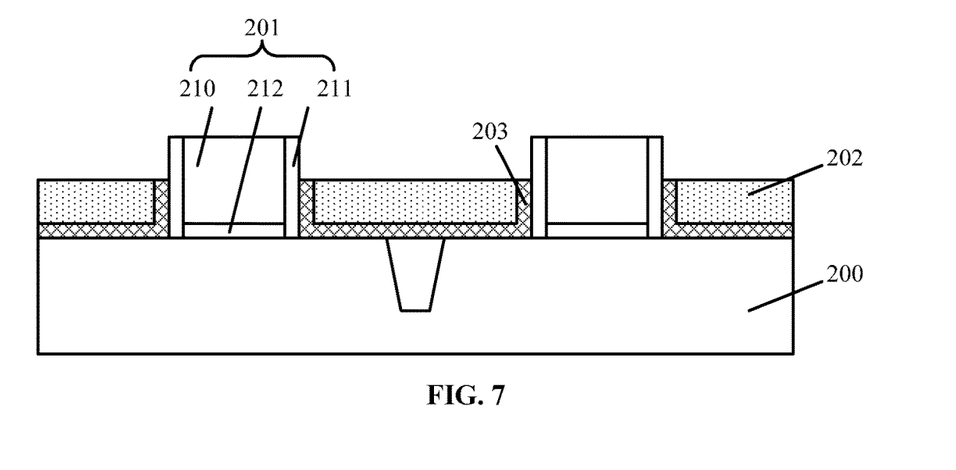

Returning to FIG. 14, after forming the first dielectric layer 202 by the planarization process, the first dielectric layer 202 may be thinned with a pre-determined depth (S103). FIG. 7 illustrates a corresponding semiconductor structure.

As shown in FIG. 7, the first dielectric layer 202 is thinned, i.e., the thickness of the first dielectric layer is reduced with a pre-determined value; and top portions of the side surfaces of the dummy gate structures 201 are exposed. Such a process may also be referred as an etch-back process.

After thinning the first dielectric layer 202, the top surface of the first dielectric layer 202 may be lower than the top surface of the dummy gate structures 201. Thus, referring to FIG. 7, the top portions of the side surfaces of the dummy gate structures 201 may be exposed. A stress layer may be subsequently formed on the exposed portions of the side surfaces of the dummy gate structures 201. The stress layer may be able to generate a tensile stress to the dummy gate structures 201. After subsequently removing the dummy gate layer 210 to form openings, the size of the top of the openings may be increased because of the tensile stress generated by the stress layer. That is, the top size of the openings may be greater than the bottom size of the openings. Thus, the technical difficulties for subsequently filling metal material in the openings may be reduced; and it may avoid forming voids in the gate electrode layer subsequently formed in the openings. Therefore, it may ensure the stability of the gate electrode layer.

The first dielectric layer 202 may be thinned by any appropriate process. In one embodiment, a mask-less process is used to thin the first dielectric layer 202. The mask-less process may be a dry etching process, a wet etching process, or a combination of a dry etching process and a wet etching process, etc.

The dry etching process for thinning the first dielectric layer 202 may be an isotropic etching process, or an anisotropic etching process. The etching gas of the dry etching process may include one or more of $CH_4$, $CH_3F$, $CH_2F_2$, and $CHF_3$, etc. The etching gas may also include Ar, or $O_2$, etc. The etching solution of the wet etching process may be a hydrogen fluoride solution, etc.

Referring to FIG. 7, in one embodiment, the sidewall spacers 211 are formed on the dummy gate layer 210. After thinning the first dielectric layer 202, the top portions of the side surfaces of the sidewall spacers 211 may be exposed. Thus, the stress slayer may be subsequently formed on the exposed side surfaces of the sidewall spacers 211.

Referring to FIG. 7, in one embodiment, the CESL 203 may be formed on the surface of the substrate 200 and the side surfaces of the dummy gate structures 201. Thus, the CESL 203 may need to be etched to cause the top surface of the CESL 203 to level with the thinned first dielectric layer 202. After removing a top portion of the CESL 203, the top portions of the side surfaces of the dummy gate structures 201 may be exposed.

Figure 8:
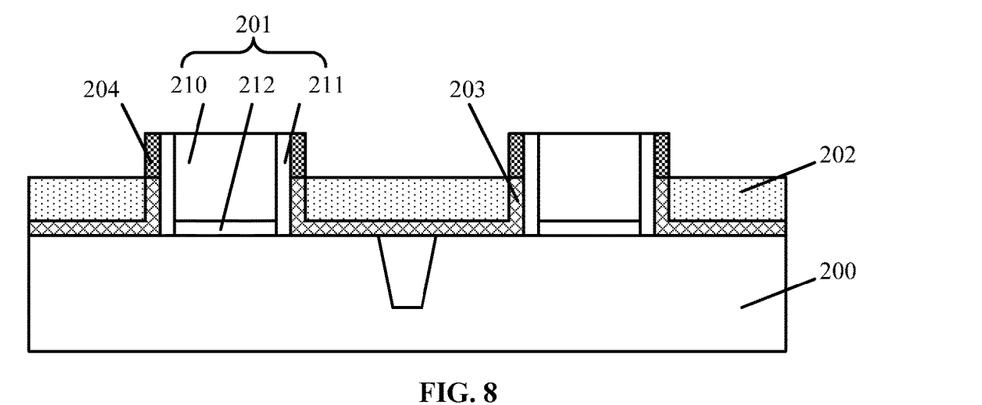

Returning to FIG. 14, after thinning the first dielectric layer 202, a stress layer may be formed (S104). FIG. 8 illustrates a corresponding semiconductor structure.

As shown in FIG. 8, a stress layer 204 is formed on the exposed side surfaces of the dummy gate structures 201. The stress layer 201 may apply tensile stress to the dummy gate layer 210. After subsequently removing the dummy gate layer 210 to form openings, the stress equilibrium between the stress layer 204 and the dummy gate layer 210 may be broken. Thus, the tensile stress may be released. After releasing the tensile stress, the stress layer 204 may be able to enlarge the top of the openings. That is, the size of the top of the opening may be greater than the size of the bottom of openings. Such a shape of the openings may aid to subsequently form a dense and uniform gate electrode layer in the openings.

The stress layer 204 may be made of any appropriate material, such as silicon nitride, silicon oxynitride, and doped silicon nitride, etc. In one embodiment, the stress layer 204 is made of silicon nitride. The stress layer 204 made of silicon nitride may generate a tensile stress.

The thickness of the stress layer 204 may be in a range of approximately 20 Å~200 Å. If the stress layer 204 is significantly thick, the size of the top of the openings may be relatively large. The size of the subsequently formed gate electrode layer may be affected; and the performance of the gate electrode layer may also be affected. If the stress layer 204 is substantially thin, the top of the openings may not be enlarged enough. Thus, voids may still be formed in the gate electrode layer. When the thickness of the stress layer 204 is in a range of approximately 20 Å~200 Å, the stress layer 204 may be able to enlarge the openings to have a desired size; and it may also be able to ensure the subsequently formed gate electrode layer to have a desired standard size and a stable performance.

A process for forming the stress layer 204 may include forming a stress film on the surface of the thinned first dielectric layer 202, and the top and side surfaces of the dummy gate structures 201; and performing an etch-back process on the stress film until the surface of the thinned first dielectric layer 202 and the top surface of the dummy gate structures 201 are exposed. Thus, the stress layer 204 may be formed.

The stress film may be formed by any appropriate process, such as a CVD process, an ALD process, or a flowable CVD (FCVD) process, etc. In one embodiment, the stress film is formed by a CVD process.

Various processes may be used as the etch-back process, such as a dry etching process, a wet etching process, or an ion beam etching process, etc. In one embodiment, the etch-back process is a dry etching process.

Figure 9:
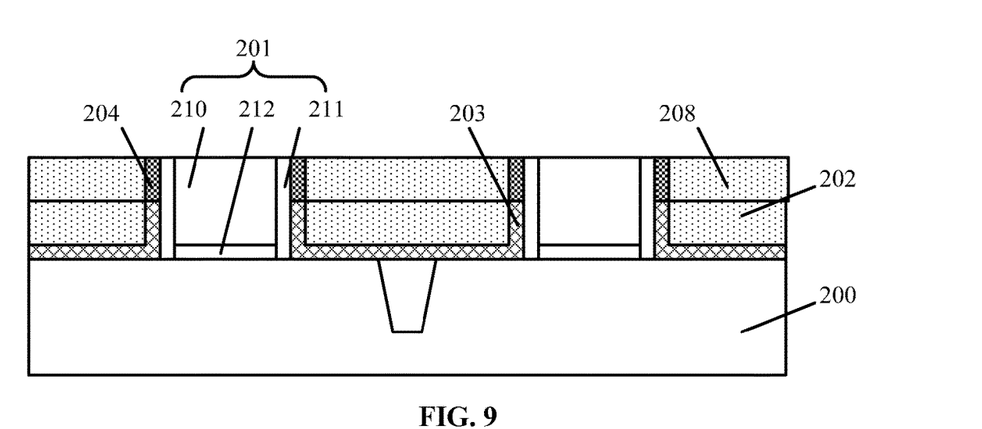

Returning to FIG. 14, after forming the stress layer 204, a second dielectric layer may be formed (S105). FIG. 9 illustrates a corresponding semiconductor structure.

As shown in FIG. 9, a second dielectric layer 208 is formed on the surface of the thinned first dielectric layer 204. The top surface of the second dielectric layer 208 may level with the top surface of the dummy gate structures 201.

The second dielectric layer 208 and the thinned first dielectric layer 204 may be together used to electrically insulate the adjacent dummy gate structures 201 and the subsequently formed adjacent gate structures. After subsequently removing the dummy gate layer 210, openings may be formed in the thinned first dielectric layer 204 and the second dielectric layer 208. The openings may be used to subsequently form a gate electrode layer.

The second dielectric layer 208 may be made of any appropriate material, such as silicon oxide, silicon nitride, or doped-silicon oxynitride, etc. In one embodiment, the second dielectric layer 208 is made of silicon oxide.

A process for forming the second dielectric layer 208 may include forming a second dielectric film on the surfaces of the thinned first dielectric layer 202, the stress layer 204 and the dummy gate structures 201; and planarizing the second dielectric film until the top surface of the dummy gate structures 201 is exposed. Thus, the second dielectric layer 208 may be formed.

The dielectric film may be formed by any appropriate process, such as a CVD process, or a PVD process, etc. In one embodiment, the dielectric film is formed by a CVD process. The CVD process may be one or more of an FCVD process, a high-density-plasma CVD process, and a high-aspect-ratio deposition process, etc.

The planarization process may be a chemical mechanical polishing process, a physical mechanical polishing process, or an ion beam polishing process, etc. In one embodiment, a chemical mechanical polishing process is used to planarize the second dielectric film to form the second dielectric layer 208.

In one embodiment, by controlling the processes for forming the first dielectric layer 202 and the second dielectric layer 208, for example, the high-aspect-ratio process or the high-density-plasma CVD process for forming the second dielectric layer 208 and the FCVD process for forming the first dielectric layer 202, the density of the second dielectric layer 208 may be greater than the density of the first dielectric layer 202. Thus, the hardness and the physical strength of the second dielectric layer 208 may be relatively large. When a gate layer is subsequently formed in the openings formed by removing the dummy gate layer 210, the dents caused by a chemical mechanical polishing process may be prevented from forming on the surface second dielectric layer 208. Thus, it may avoid forming residual gate material on the surface of the second dielectric layer 208; and leakage current may be avoided.

Figure 10:
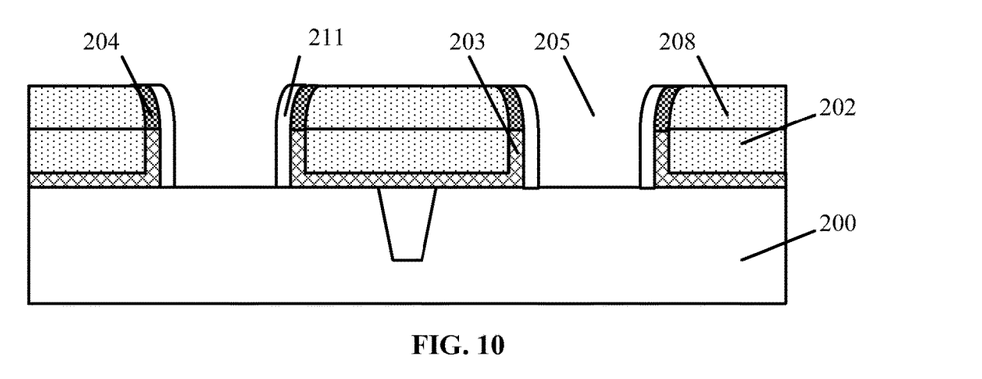

Returning to FIG. 14, after forming the second dielectric layer 208, the dummy gate layer 210 may be removed; and openings may be formed (S106). FIG. 10 illustrates a corresponding semiconductor structure.

As shown in FIG. 10, the dummy gate layer 210 is removed; and openings 205 are formed in the thinned first dielectric layer 202 and the second dielectric layer 208. The openings 205 may be used to subsequently form a gate electrode layer.

The dummy gate layer 210 may be removed by any appropriate process, such as a dry etching process or a wet etching process, etc. The dry etching process may be an isotropic dry etching process, or an anisotropic dry etching process. The wet etching process may be an anisotropic wet etching process.

In one embodiment, the dummy gate layer 210 may be made of polysilicon. Thus, the etching gas of the dry etching process may include one or more of $Cl_2$ and HBr, etc. The etching solution of the wet etching process may include Tetramethylammonium hydroxide (TMAH), etc.

In one embodiment, referring to FIG. 9, the dummy gate dielectric layer 212 may be formed between the dummy gate layer 210 and the substrate 200. Thus, after removing the dummy gate layer 210, the dummy gate dielectric layer 212 may be removed; and the openings 205 may expose the surface of the substrate 200. Because the etching selectivity between the dummy gate dielectric layer 212 and the substrate 200 may be relatively large, the damage to the surface of the substrate 200 may be substantially small when the dummy gate dielectric layer 212 is removed.

In one embodiment, the dummy gate dielectric layer 212 may be removed by a wet etching process; and the etching solution may be a HF solution. Such a process may have a substantially small damage to the surface of the substrate 200.

In certain other embodiments, a high-K gate dielectric layer may be formed between the dummy gate dielectric layer 212 and the substrate 200. After removing the dummy gate dielectric layer 212, the openings 205 may expose the high-K gate dielectric layer.

Referring to FIG. 10, the stress layer 204 may have a tensile stress to the dummy gate layer 210, after removing the dummy gate layer 210, the stress equilibrium between the dummy gate layer 210 and the stress layer 204 may be broken; and the tensile stress may be released. Thus, the top portion of the openings 205 may be enlarged. That is, the top size of the openings 205 may be greater than the bottom size of the openings 205. Such a shape of the openings 205 may aid to subsequently form a dense and uniform layer in the openings 205.

Figure 11:
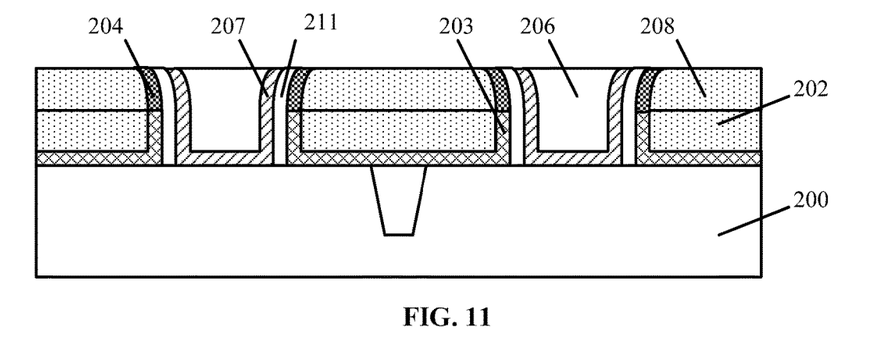

Returning to FIG. 14, after forming the openings 205, a gate electrode layer may be formed (S107). FIG. 11 illustrates a corresponding semiconductor structure.

As shown in FIG. 11, a gate electrode layer 206 is formed in the openings 205. A process for forming the gate electrode layer 206 may include forming a gate film on the surface of the second dielectric layer 208 and in the openings 205, the gate film may fill the opening 205; and followed by planarizing the gate film until the surface of the second dielectric layer 208 is exposed. Thus, the gate electrode layer 206 may be formed.

The gate electrode layer 206 may be made of any appropriate material, such as W, Al, Cu, Ti, Ag, Au, Pb, or Ni. Various processes may be used to form the gate film, such as a CVD process, a PVD process, an electroplating process, or a chemical plating process, etc. The gate film may be planarized by a chemical mechanical polishing process, or a physical mechanical polishing process, etc.

Because the top size of the openings 205 may be greater than the bottom size of the openings 205, the portion of the gate film in the openings 205 may be dense and uniform; and voids may not be easily formed. Thus, the gate electrode layer 206 may be dense and uniform; and the electrical properties of the gate electrode layer 206 may be stable. Therefore, the performance of the transistor having such a gate electrode layer 206 may match the designed requirements.

Referring to FIG. 11, in one embodiment, a gate dielectric layer 207 may be formed on the side surfaces and bottom surface of the openings 205 before forming the gate electrode layer 206. The gate electrode layer 206 may be formed on the gate dielectric layer 207.

A process for forming the gate dielectric layer 207 may include forming a gate dielectric film on the surface of the second dielectric layer 208 and the side and bottom surfaces of the openings 205; forming the gate electrode film on the gate dielectric film; and planarizing the gate electrode film and the gate dielectric film until the surface of the second dielectric layer 208 is exposed. Thus, the gate dielectric layer 207 and the gate electrode layer 206 may be formed.

The gate dielectric layer 207 may be made of high-K material, etc. The high-K material may include LaO, AlO, BaZrO, HfZrO, HfLaO, HfSiO, HfSiNO, LaSiO, AlSiO, HfTaO, HfTiO, (Ba, Sr)TiO$_3$, Al$_2$O$_3$, or Si$_3$N$_4$, etc. Various processes may be used to form the gate dielectric film, such as a CVD process, a PVD process, or an ALD process, etc. The thickness of the gate dielectric layer 207 may be in a range of approximately 10 Å~50 Å.

In one embodiment, after removing the dummy gate layer 210 to expose the surface of the substrate 200 and before forming the gate dielectric film, an interface layer may be formed on the surface of the substrate 200 on the bottom of the openings 205. The interface layer may increase the bonding force between the gate dielectric film and the substrate 200. The thickness of the interface layer may be in a range of approximately 5 Å~10 Å.

The interface layer may be made of any appropriate material, such as silicon oxide, or silicon nitride, etc. Various processes may be used to form the interface layer, such as a thermal oxidation process, a nitric oxidation process, a chemical oxidation process, a CVD process, a PVD process, an ALD process, or a wet oxidation process, etc.

In one embodiment, after forming the gate dielectric film and before forming the gate electrode film, a work function film may be formed on the surface of the gate dielectric film. The work function film may be used to form a work function layer. The work function layer may be used to adjust the threshold voltage of the transistor. The work function of a PMOS transistor and an NMOS transistor may be different. Thus, the material of the work function film in the PMOS transistor region and the material of the work function film in the NMOS transistor region may be different. In one embodiment, the material of the work function film formed in the PMOS transistor region may include TiN, etc. The material of the work function film formed in the NMOS transistor region may include TiAl, etc.

In certain other embodiments, when the dummy gate layer 210 is removed, the openings 205 may expose the dielectric layer made of high-K material. Thus, the work function film and/or the gate electrode film may be directly formed on the gate dielectric layer.

The planarization process may be a chemical mechanical polishing process, etc. The chemical mechanical polishing process may be stopped when the surface of the second dielectric layer 208 is exposed. In one embodiment, the gate dielectric film may be formed on the second dielectric layer 208 and the work function film may be formed on the gate dielectric film. Thus, the chemical mechanical polishing process may also polish the work function film and the gate dielectric film until the surface of the second dielectric layer 208 is exposed. Thus, a gate dielectric layer and a work function layer may be formed in the openings 205.

Therefore, a semiconductor structure with a plurality of transistors may be formed by the above disclosed processes and methods; and the corresponding semiconductor structure is illustrated in FIG. 11. As shown in FIG. 11, the semiconductor structure may include a substrate 200 and a plurality of gate structures (not labelled). The gate structure may include a gate dielectric layer 207 formed on the substrate 200, a gate electrode layer 206 formed on the gate dielectric layer 207, and sidewall spacers 211 on the side surfaces of the gate dielectric layer 207. Further, the semiconductor structure may include a stress layer 204 formed the top portions of the side surfaces of the sidewall spacers 211 to enlarge the top size of the openings for forming the gate electrode layer 206. Further, the semiconductor structure may also include a CESL 203 formed on the surface of the substrate 200 and the bottom portion of the side surfaces of the sidewall spacers 211. Further, the semiconductor structure may also include a thinned first dielectric layer 202 formed on the CESL 203 and a second dielectric layer 208 formed on the thinned first dielectric layer 202. The detailed structures and intermediate structures are described above with respect to the fabrication processes.

Thus, according to the disclosed processes and structures, after forming the dummy gate structures and the first dielectric layer, the first dielectric layer may be thinned with a pre-determined thickness to cause the top surface of the first dielectric layer to be lower than the top surface of the dummy gate structures. Then, the stress layer may be formed on the exposed top portions of the sidewall spacers. Because the stress layer may have a tensile stress to the dummy gate layer, after removing the dummy gate layer to form openings, the stress equilibrium between the stress layer and the dummy gate layer may be broken. Thus, the top of the openings may be enlarged to cause the top size of the openings to be greater than the bottom size of the openings. The enlarged top of openings may lower the difficulty for forming the gate electrode layer in the openings. For example, the material of the gate electrode layer may be easy to enter into the bottom of the openings; and it may be difficult for the material of the gate electrode layer to accumulate at the top side surfaces of the openings. Thus, the material of the gate electrode layer may be able to fill the openings; the gate electrode layer formed in the openings may be dense and uniform; and voids may not be formed in the gate electrode layer. Therefore, the performance of the transistors having such a gate electrode layer may be stable; and the reliability the transistors having such a gate electrode layer may be enhanced.

Figure 12:
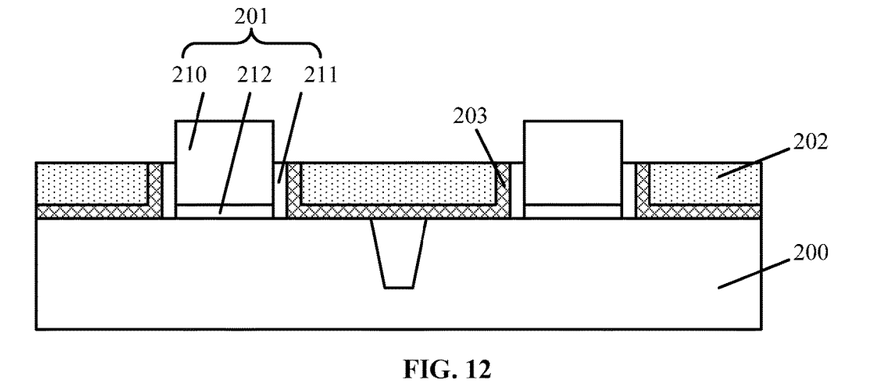
FIG. 12~13 illustrate semiconductor structures corresponding to certain stages of another exemplary fabrication process of transistors consistent with the disclosed embodiments.
Figure 13:
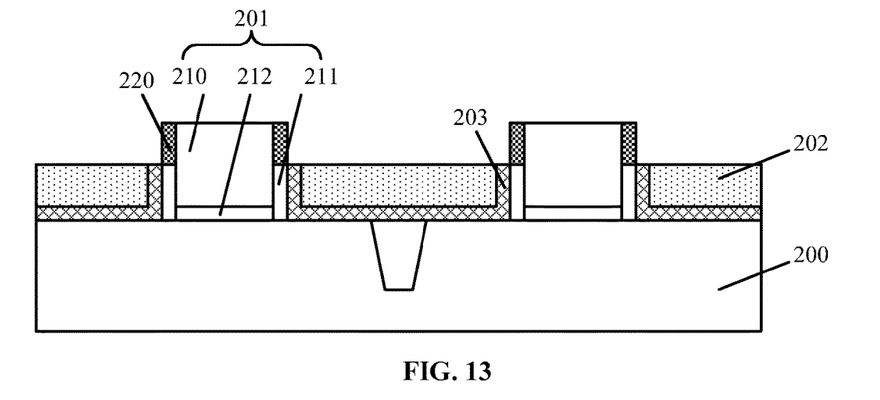

FIGS. 12~13 illustrate semiconductor structures corresponding to certain stages of another exemplary fabrication process of transistors consistent with the disclosed embodiments. For illustrative purposes, the following description is started from the structure illustrated in FIG. 7.

As shown in FIG. 12 and FIG. 7, after thinning the first dielectric layer 202, the portions of the sidewall spacers 211 higher than the top surface of the thinned first dielectric layer 202 may be removed. Thus, the side surface of the dummy gate layer 210 higher than the top surface of the thinned first dielectric layer 202 may be exposed.

A stress layer may be subsequently formed on the exposed portions of the side surfaces of the dummy gate layer 210. Thus, the stress layer and the dummy gate layer 210 may not be isolated by the sidewall spacers. After subsequently removing the dummy gate layer 210, the stress in the stress layer may be entirely released; and may not be reduced by the sidewall spacers. Thus, the stress layer may be able to further enlarge the openings formed by removing the dummy gate layer 210. The further enlarged openings may ensure the subsequently formed gate electrode layer to be dense and uniform; and it may not easy to form voids in the gate electrode layer.

The portions of the sidewall spacers 211 higher than the thinned first dielectric layer 202 may be removed by any appropriate process, such as a dry etching process, or a wet etching process, etc. The dry etching process may be an isotropic dry etching process, or an anisotropic dry etching process. The wet etching process may be an isotropic wet etching process.

The etching gas of the dry etching process may include one or more of $CH_4$, $CH_3F$, $CH_2F_2$, and $CHF_3$, etc. The etching gas may also include Ar, or $O_2$, etc. When the sidewall spacers 211 are made of silicon oxide, the etching solution of the wet etching process may by a HF solution. When the sidewall spacers 211 is made of silicon nitride, the etching solution of the wet etching process may be a phosphorous solution.

Further, as shown in FIG. 13, after removing the portions of sidewall spacers 211 higher than the thinned first dielectric layer 202, a stress layer 220 may be formed on the exposed portions of side surfaces of the dummy gate layer 210. The stress layer 220 may apply a tensile stress to the dummy gate layer 210. After subsequently removing the dummy gate layer 210, the stress equilibrium between the stress layer 220 and the dummy gate layer 210 may be broken; and the stress may be released. Thus, the top portion of the openings formed by removing the dummy gate layer 210 may be enlarged. The enlarged openings may aid to subsequently form a gate electrode layer in the openings.

Further, the stress layer 220 may be formed on the exposed side surfaces of the dummy gate layer 210; and there may be no sidewall spacers between the stress layer 220 and the dummy gate layer 210. Thus, after subsequently removing the dummy gate layer 210, the stress applied by the stress layer may be not be reduced; and the top size of the openings may be further increased.

The stress layer 220 may be made of any appropriate material. In one embodiment, the stress layer 220 is made of silicon nitride. The stress layer 220 made of silicon nitride may applied a tensile stress to the dummy gate layer 210.

The thickness of the stress layer 220 may be in a range of approximately 20 Å~200 Å. If the stress layer 220 is significantly thick, the top size of the subsequently formed openings may be significantly large. Thus, the size of the subsequently formed gate electrode layer and the performance of the subsequently formed gate electrode layer may be affected. If the stress layer 220 is substantially thin, the top of the openings may not be enlarged enough, voids may still be formed in the gate electrode layer. When the thickness of the stress layer 220 is in a range of approximately 20 Å~200 Å, the top of the openings may be enlarged enough; and it may ensure the gate electrode layer to have the designed size and stable performance.

A process for forming the stress layer 220 may include forming a stress film on the surface of the first dielectric layer 202 and the side and top surfaces of the dummy gate structures 201; and performing an etch back process on the stress film until the surface of the first dielectric layer 202 and the top surface of the dummy gate structures 201 are exposed. Thus, the stress layer 220 may be formed.

The stress film may be formed by any appropriate process, such as a CVD process, a PVD process, or an ALD process. In one embodiment, the stress film is formed by a CVD process.

The etch-back process may be any appropriate process, such as a dry etching process, or a wet etching process, etc. In one embodiment, the etch-back process is a dry etching process.

After forming the stress layer 220, a second dielectric layer may be formed on the surface of the thinned first dielectric layer 202. The top surface of the second dielectric layer may level with the top surface of the dummy gate structures 201. Further, after forming the second dielectric layer, the dummy gate layer 210 may be removed to form openings in the thinned first dielectric layer 202 and the second dielectric layer; and then a gate electrode layer may be formed in the openings. Thus, transistors may be formed.

Thus, after thinning the first dielectric layer, the sidewall spacers higher than the thinned first dielectric layer may be removed; and the stress layer may be formed on the exposed side surfaces of the dummy gate layer. Because the stress layer may be directly formed on the side surfaces of the dummy gate layer; and there may be not sidewall spacers between the stress layer and the dummy gate layer, the stress in the stress layer may be entirely released after subsequently removing the dummy gate layer; and the stress may not be reduced because of the sidewall spacers. Thus, the top of the openings may be further enlarged, it may further aid to form a dense and uniform gate electrode layer in the openings; and voids may not be formed in the gate electrode.

Thus, another semiconductor structure having a plurality of the transistors may be formed by the disclosed processes. The corresponding semiconductor structure may refer to FIG. 9. The major difference may be that the top surface of the sidewall spacers 211 may level with the top surface of the thinned first dielectric layer 202; and the stress layer 220 is formed on the portions of the side surfaces of the gate electrode layer higher than the top surface of the thinned first dielectric layer 202. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. A method for fabricating a semiconductor structure having a plurality of transistors, comprising:
   providing a substrate having at least a dummy gate structure having at least dummy gate layer;
   forming a first dielectric layer on the substrate;
   thinning the first dielectric layer with a pre-determined depth to cause a top surface of the dielectric layer to be lower than a top surface of the dummy gate structure and expose top portions of side surfaces of the dummy gate structure;

forming a stress layer on the exposed portions of the side surfaces of the dummy gate structure;

forming a second dielectric layer on the thinned first dielectric layer;

removing the dummy gate layer to form an opening with an enlarged top size caused by releasing stress in the stress layer previously formed on the exposed portions of the side surfaces of the dummy gate structure; and forming a gate electrode layer in the opening with the enlarged top size.

2. The method according to claim 1, wherein:
the stress layer is made of silicon nitride; and
a thickness of the stress layer is in a range of approximately 20 Å~200 Å.

3. The method according to claim 1, wherein forming the stress layer further includes:
forming a stress film on surface of the thinned first dielectric layer, the exposed portions of the side surfaces of the dummy gate structure and top surface of the dummy gate structure; and
performing an etching-back process on the stress film until the surface of the thinned first dielectric layer and the top surface of the dummy gate structure are exposed.

4. The method according to claim 3, wherein:
the stress film is formed by a chemical vapor deposition process; and
the etch-back process is a dry etching process.

5. The method according to claim 1, further including:
forming sidewall spacers on the side surfaces of the dummy gate electrode layer.

6. The method according to claim 5, after thinning the first dielectric layer, further including:
removing portions of the sidewall spacers higher than the top surface of the thinned first dielectric layer to expose portions of the side surfaces of the dummy gate layer higher than the top surface of thinned first dielectric layer; and
forming the stress layer on the exposed portions of the side surfaces of the dummy gate layer.

7. The method according to claim 1, further including:
forming a dummy gate dielectric layer on the substrate before forming the dummy gate layer.

8. The method according to claim 7, wherein:
the dummy gate dielectric layer is made of silicon oxide;
a thickness of the dummy gate dielectric layer is in a range of approximately 5 Å~10 Å; and
the dummy gate dielectric layer is formed by one of a thermal oxidation process, an in situ-gas-generation process and a chemical vapor deposition process.

9. The method according to claim 8, further including:
forming a gate dielectric layer on the substrate before forming the dummy gate dielectric layer.

10. The method according to claim 1, before forming the gate electrode layer, further including:
forming a gate dielectric layer.

11. The method according to claim 10, before forming the gate dielectric layer and after removing the dummy gate layer, further including:
forming an interface layer on the substrate.

12. The method according to claim 1, wherein:
the interface layer is made of one of silicon oxide and silicon oxynitride;
the interface layer is formed by one of a thermal oxidation process, a nitric oxidation process, a chemical oxidation process, a chemical vapor deposition process, a physical vapor deposition process, an atomic layer deposition process and a wet oxidation process; and
a thickness of the interface layer is in a range of approximately 5 Å~10 Å.

13. The method according to claim 1, wherein forming a first dielectric layer further includes:
forming a first dielectric film on the substrate and dummy gate structure; and
planarizing the first dielectric film until top surface of the dummy gate structure is exposed.

14. The method according to claim 13, before forming the first dielectric film, further including:
forming a contact etching stop layer on the substrate and the dummy gate structure; and
removing portions of the contact etching stop layer on the top surface of the dummy gate structure after planarizing the first dielectric film to expose the top surface of the dummy gate structure.

15. The method according to claim 14, wherein:
the contact etching stop layer is made of one of silicon nitride, silicon oxynitride, carbon-doped silicon nitride, and boron-doped silicon nitride;
the contact etching stop layer is formed by one of a chemical vapor deposition process and an atomic layer deposition process; and
a thickness of the contact etching stop layer is in a range of approximately 10 Å~30 Å.

* * * * *